United States Patent Office 3,551,235

Patented Dec. 29, 1970

3,551,235

RADIATION-CURABLE COMPOSITIONS

Robert W. Bassemir, Jamaica, N.Y., and Richard Dennis, East Rutherford, and Gerald I. Nass, West New York, N.J., assignors to Sun Chemical Corporation, New York, N.Y., a corporation of Delaware

No Drawing. Continuation-in-part of application Ser. No. 651,975, July 10, 1967. This application Nov. 24, 1967, Ser. No. 685,253

Int. Cl. B32b *17/00;* C08f *1/16;* C08d *1/00*

U.S. Cl. 156—99 35 Claims

ABSTRACT OF THE DISCLOSURE

Certain halogenated hydrocarbons act as improved photoinitiators for photopolymerizable compounds comprising an ester of an ethylenically unsaturated acid and a dihydric alcohol or a trihydric alcohol and a film forming compound consisting of an aryl sulfonamide-formaldehyde resin or cetyl vinyl ether and methods of use thereof, such as coating or laminating.

The present application is a continuation-in-part of copending application Ser. No. 651,975, filed July 10, 1967, now abandoned. It relates to photopolymerizable compositions, elements, and processes of photopolymerization. More particularly, this invention relates to compositions containing a photopolymerizable polyfunctional ethylenically unsaturated compound and novel sensitizers or photoinitiators providing compositions having improved oxygen-exposed curing properties, improved cure speeds, and improved thermal stability as well as excellent shelf life at ambient temperatures and normal light exposure.

In the past, it has been known to prepare compositions such as coating materials and the like which consisted primarily of photopolymerizable ethylenically unsaturated monomeric materials. It is also known that the monomeric materials when exposed to actinic energy are converted to polymers, In the absence of the photoinitiator, this conversion proceeds very slowly. Attempts have been made, therefore, to find compounds which may be added to the polymerizable materials to accelerate the polymerization.

As sensitizers or photoinitiators, the prior art has used compounds of the type of the acyloins. These absorb light rays and as a result free radicals are formed which are capable of initiating polymerization. Oxygen tends to inhibit surface photopolymerization, especially in thin films. With the use of the novel initiators of this inventon, the problem of oxygen-inhibition has been overcome. Various methods of excluding oxygen which have been proposed are cumbersome and expensive to use; although the prior art processes have proved satisfactory for their intended purposes, the practical applications in the surface coatings field are limited.

It has been found that modifying the photopolymerizable compound to reduce or substantially eliminate the polymerization inhibiting effect of atmospheric oxygen provides a substantial improvement over the prior art. The oxygen-exposed curing may be improved by the addition of a compatible film-forming compound which will substantially reduce the inhibitory period in the polymerization reaction caused by the presence of oxygen, as set forth in the application Ser. No. 556,568, filed June 10, 1966.

The photopolymerizable compounds usable in the present invention are free radical polymerizable polyethylenically unsaturated monomers and prepolymers, e.g., dimers, trimers, and other oligomers, and mixtures and copolymers thereof. The term "polyethylenically unsaturated" as employed in the specification and claims refers to compounds having two or more terminal ethylenic groups. The preferred photopolymerizable compounds may be generally described as the acrylic acid esters, the methacrylic acid esters, and the itaconic acid esters of aliphatic polyhydric alcohols, such as, for example, the di- and polyacrylates, the di- and polymethacrylates, and the di- and polyitaconates of ethylene glycol, triethylene glycol, tetraethylene glycol, tetramethylene glycol, trimethylalethane, and trimethylalpropane. Typical operable photopolymerizable compounds include trimethylalpropane triacrylate; trimethylalpropane trimethacrylate; trimethylolethane triacrylate; trimethylolethane trimethacrylate; tetramethylene glycol dimethacrylate; ethylene glycol dimethacrylate; triethylene glycol dimethacrylate; tetraethylene glycol diacrylate; tetraethylene glycol dimethacrylate; and the like; and the prepolymers and mixtures thereof. The photopolymerizable compounds may be used in amounts ranging between about 15 and 90% by weight of the complete photopolymerizable composition, and preferably about 30 to 70% by weight.

The above-described esters of aliphatic polyhydric alcohols may be obtained in any convenient manner, for example, by the ester interchange method of interacting a lower alkyl ester of the acid with the alcohol in the presence of a suitable catalyst or by the reaction of the alcohol with, e.g., an acrylyl halide or a methacrylyl halide.

The novel sensitizers or photoinitiators of the present invention are halogenated hydrocarbons which may be aromatic, aliphatic, or alicyclic, and their mixtures. The halogen atom is attached directly to the ring structure in the aromatic and alicyclic compounds; that is, the halogen is bonded directly to the aromatic hydrocarbon nucleus or the halogen atom is attached to the carbon chain in the aliphatic compounds. These sensitizers or photoinitiators are used in amounts of about 5 to 75% by weight and preferably from 20% to 50% of the total photopolymerizable composition. Suitable photoinitiators include, for example, polychlorinated polyphenyl resins, such as the Araclor plasticizers (Monsanto Chemical Company) which in general are polychlorinated diphenyls, polychlorinated triphenyls, and mixtures of polychlorinated diphenyls and polychlorinated triphenyls; chlorinated rubbers, such as the Parlons (Hercules Powder Company); copolymers of vinyl chloride and vinyl isobutyl ether, such as Vinoflex MP–400 (BASF Colors & Chemicals Inc.); chlorinated aliphatic waxes, such as Chlorowax 70 (Diamond Alkali Inc.); perchloropentacyclodecane, such as Dechlorane+ (Hooker Chemical Co.); chlorinated paraffins, such as Clorafin 40 (Hooker Chemical Co.); and Unichlor–70B (Neville Chemical Co.); mono- and polychlorobenzenes, e.g., di-, tri-, tetra-, penta-, and hexa-; mono- and polybromobenzenes, e.g., di-, tri-, tetra-, penta-, and hexa-; mono- and polychloro- and bromoxylenes, e.g., di-, tri-, tetra-, penta-, and hexa-; dichloromaleic anhydride; 1-chloro-2-methyl naphthalene; 2,4-dimethylbenzene sulfonyl chloride; 1-bromo-3-(m-phenoxyphenoxy benzene); 2-bromoethyl methyl ether; chlorendic anhydride; and the like; and mixtures thereof. When these sensitizers or photoinitiators are used in photopolymerizable compositions, thin films, about 0.5 to about 150 microns, have been cured in much less than one second. By adding a small percentage, about 0.5 to about 10 percent, of a compatible known sensitizer or photoinitiator, such as benzoin methyl ether, the curing rate can be accelerated even further.

Variables determining the rate at which a photopolymerizable composition will cure include the specific ingredients in the composition, concentration of the photoinitators, thickness of the material, nature and intensity of the radiation source and its distance from the material, the presence or absence of oxygen, and the ambient temperature. The compositions of the present invention may be used in relatively thick layers or may be cast as thin films having thicknesse of from about 0.5 to 150 microns, and preferably from about 1 to 10 microns. Some of the sources of radiation used are a 100-watt Hanovia high pressure mercury arc quartz ultraviolet lamp; larger ultraviolet sources of higher wattage; a linear electron accelerator; or gamma radiation emitters, such as cobalt-60. Distances of the lamp from the work may range from about ¼ to 10 inches, and preferably from about ¼ to 3 inches.

Depending on the lamp source, photopolymerizable compositions containing only free radical polymerizable ethylenically unsaturated compounds and the novel sensitizers or photoinitiators may require up to milliseconds and greater exposures at variable distances from the substrate when in thin films. This time may be further reduced by including modifiers as hereinafter described. Since in many practical applications such as the use of photopolymerizable compositions in coatings or in printing inks exclusion of oxygen is difficult and/or expensive to achieve, in the present invention materials are added to the photopolymerizable compound which are compatible therewith and which will reduce the polymerization-inhibiting effect of oxygen in the presence of the novel initiators.

The photopolymerizable compound may be used with an unsaturated compound including, for example, unsaturated polyester resins, especially unsaturated alkyd resins; conjugated drying oils, e.g., tung oil and Chinawood oil; and oil-modified alkyd resins. The unsaturated compound preferably contains one or more allylic groups and may be used in amounts of from about 10 to 85 percent by weight of the photopolymerizable mixture.

The photopolymerizable compound may also be modified by inclusion of a compatible compound which is coreactive with it in the presence of oxygen. A viscosity control agent, for example, may be introduced into the system to cross-link with the compound and add plasticizing properties thereto. Some coreactive substances which may be added to the polypolymerizable compound include unsaturated polyester resins, epoxy resins, urea formaldehyde resins, cetyl vinyl ether, and aryl sulfonamide-formaldehyde resins, such as a p-toluene sulfonamide-formaldehyde resin. The polyester resins, for example, improve the adhesive properties of the composition and add plasticizing properties thereto. The epoxy resins, i.e., synthetic resins possessing terminal epoxide groups, e.g., a lower molecular weight polymer produced by condensation of epichlorhydrin with bisphenol A, produce excellent bonding and result in flexible films which are especially suitable for lamination purposes. The urea formaldehyde resins work particularly well in heat catalyst systems wherein the temperatures of the surrounding atmosphere are raised to about 150° F. or higher. The cetyl vinyl ether lends plasticizing properties to the photopolymerizable composition. These resins and monomers may be utilized in amounts between about 10 and 50 percent by weight of the photopolymerizable mixture.

Prepolymers, such as diallyl phthalate prepolymers, may be added to the photopolymerizable compound to react therewith in the presence of oxygen. The prepolymers may be used in amounts of from about 10 to 50 percent by weight of the photopolymerizable composition and result in tough, more flexible surface-cured films.

The above-described photopolymerizable compound may also be improved by the inclusion of from about 0.1 to 2 percent by weight of a chain transfer agent. Suitable compounds include the mercaptans and derivatives thereof, e.g., glycol mercaptoacetate and ethyl mercaptoacetate; tertiary aliphatic amines, e.g., triethanolamine and t-butyldiethanolamine; morpholine; n-amino morpholine; cyclicized unsaturated aromatic hydrocarbons, e.g., neohexene, cyclohexene, cyclo-octene, and d-limonene; and the like; and mixtures thereof. Typical cure times with the use of compositions including chain transfer agents have been much less than one-half second when a film about 1 to 10 microns thick is exposed to actinic energy.

The above-described additives may further be used in varying mixtures. The photopolymerizable compounds of the present invention may be modified by addition of a prepolymer and a chain transfer agent; a prepolymer and an unsaturated compound reactive with oxygen, e.g., an alkyd resin; a prepolymer and a further modifying substance, e.g., cetyl vinyl ether; a viscosity control agent together with a chain transfer agent, a prepolymer, or other modifying resin; and mixtures thereof. In general, in the photopolymerizable compositions of the present invention, the photopolymerizable compound is utilized in amounts of from about 15 to 90 percent by weight and the modifying compound or compounds in amounts of from about 10 to 85 percent by weight of the photopolymerizable mixture; the sensitizer or photoinitiator is present in amounts of from about 5 to 75 percent by weight of the total composition. In some embodiments, the presence of an inert atmosphere, e.g., carbon dioxide, and the use of moderately elevated temperatures, e.g., from about 150° to 180° F., are preferred.

The photopolymerizable compositions of the present invention are suitable as adhesives, particularly in the laminating art; as coatings for paper, metals, plastics, textiles, and glass; as markers for roads, parking lots, airfields, and similar surfaces; as vehicles for printing inks, lacquers, and paints; and in the preparation of photopolymerizable elements, i.e., a support having disposed thereon a photopolymerizable layer of a composition as described herein. Furthermore, various dyestuffs, pigments, plasticizers, lubricants, and other modifiers may be incorporated to obtain certain desired characteristics in the finished products.

When a photopolymerizable composition of the present invention is used as a laminant, at least one of the lamina must be translucent when ultraviolet light is used. When the radiation source is an electron beam, however, at least one of the lamina must be capable of transmitting high energy electrons and neither is necessarily translucent to light. Typical laminations include cellophane to cellophane films, treated polyethylene to treated polyethylene films, Mylar to a metal substrate such as copper, opaque oriented polypropylene to aluminum, and the like. Particularly suitable compositions for use in lamination include mixtures of the photopolymerizable compound with both an aryl sulfonamide-formaldehyde resin and an epoxy resin. The latter system gives a highly suitable, flexible plasticized film giving a tear seal for coated cellophane to coated cellophane and coated cellophane to treated polypropylene laminations and near tear seals for treated polyethylene to treated polyethylene laminations.

The photopolymerizable compositions of the present invention may be utilized for metal coatings and particularly for metals which are to be subsequently printed. Glass and certain plastics may also be coated, and the coatings are conventionally applied by roller or spray. Pigmented coating systems may be used for various polyester and vinyl films; glass; polymer-coated cellophane; treated and untreated polyethylene, for example in the form of disposable cups or bottles; and the like. Examples of metals which may be coated include sized and unsized tin plate.

When used as vehicles for inks, e.g., printing inks, the compositions of the present invention should include photopolymerizable compounds which are high boiling. The compositions may be pigmented with many organic or inorganic pigments, e.g., molybdate orange, titanium white, phthalocyanine blue, chrome yellow, and carbon black, as well as colored by conventional dyes. Stock which may be printed includes paper, clay-coated paper, and board. In addition, the compositions of the present invention are suitable for the treatment of textiles, both natural and synthetic, e.g., in vehicles for textile printing inks or for specialized treatments of fabrics to produce water repellency, oil and stain resistance, crease resistance, etc.

Photopolymerizable elements of this invention comprise a support, e.g., a sheet or plate, having superimposed thereon a layer of the above-described photopolymerizable compositions. Suitable base or support materials include metals, e.g., steel and aluminum plates, sheets, and foils, and films or plates composed of various film-forming synthetic resins or high polymers, such as addition polymers, and in particular vinyl polymers, e.g., vinyl chloride polymers; vinylidene chloride polymers; vinylidene chloride copolymers with vinyl chloride, vinyl acetate, or acrylonitrile; and vinyl chloride copolymers with vinyl acetate or acrylonitrile; linear condensation polymers such as polyesters, e.g., polyethylene terephthalate; polyamides; etc. Fillers or reinforcing agents can be present in the synthetic resin or polymer bases. In addition, highly reflective bases may be treated to absorb ultraviolet light, or a light-absorptive layer can be transposed between the base and photopolymerizable layer.

Photopolymerizable elements can be made by exposing to ultraviolet light selected portions of the photopolymerizable layer thereof until addition polymerization is completed to the desired depth in the exposed portions. The unexposed portions of the layer are then removed, e.g., by use of solvents which dissolve the monomer or prepolymer but not the polymer.

Photopolymerizable solutions prepared by mixing about 60 to 70 percent of a one-to-one mixture of trimethylol propane triacrylate and Santolite MPH (a p-toluene sulfonamide-formaldehyde resin manufactured by Monsanto Company) and about 30 to 40% of an Aroclor (polychlorinated polyphenyl resins) cured to surface-dry, hard, tough, and somewhat brittle films in about one second when exposed to a Hanovia arc lamp at a distance of one-half inch. These films cured satisfactorily in the presence of oxygen in the absence of known sensitizers or photoinitiators such as benzoin methyl ether or chain transfer agents such as cyclohexene or triethanolamine heretofore necessary to cure these compounds.

The invention and its advantages will be better understood with reference to the following illustrative examples, but is not intended to be limited thereto. In the examples, the percentages are given by weight unless otherwise specified. Unless otherwise indicated, the ingredients were mixed until thoroughly blended. When a specific ingredient is solid at room temperature, the mixture may be heated to melt the solid ingredient, but generally not above 100° C. The atmospheric and temperature conditions were ambient unless otherwise noted; in Examples 1–39 the compositions were exposed at a distance of ½ inch or 1 inch as indicated from Hanovia high pressure mercury arc quartz ultraviolet lamp in film thicknesses between 1 and 10 microns.

EXAMPLES 1–5

The following solutions were prepared by combining a 1:1 mixture of trimethylalpropane triacrylate and Santolite MPH (a p-toluene sulfonamide-formaldehyde resin) with the indicated percentage of Aroclor 1260. The cure times, i.e., the exposure times necessary to produce a bone dry surface, were determined by exposing a thin film of each solution on a glass slide to a 100-watt ultraviolet source at the indicated distance while in the presence of oxygen.

| | Cure time, seconds | |
|---|---|---|
| Photopolymerizable composition | ½″ from source | 1″ from source |
| 95% mixture, 5% Aroclor 1260 | 10 | 18 |
| 90% mixture, 10% Aroclor 1260 | 4 | 10 |
| 70% mixture, 30% Aroclor 1260 | <2.5 | <5 |
| 50% mixture, 50% Aroclor 1260 | <1.0 | <3 |
| 30% mixture, 70% Aroclor 1260 | 3.0 | 8 |

In each case, the cured film had tough, somewhat brittle properties with excellent adhesion to the respective glass slide.

EXAMPLES 6–15

A photopolymerizable mixture of 50% of trimethylolpropane triacrylate and 50% of Santolite MHP was tested with the following chlorinated aromatic resins and waxes in the percentages and distances from the 100-watt Hanovia lamp indicated. The symbol < is used to indicate exposure time "less than" that noted, > indicates the converse, and ~ indicates the exposure time was "about" that noted.

| Composition | | Curing time, seconds | | |
|---|---|---|---|---|
| Photopolymerizable mixture, percent | Initiator | ½ inch | 1 inch | Remarks |
| 70 | 30% Aroclor 1268 | <2 | ~5 | Dry top, tack free. |
| 90 | 10% Aroclor 1268 | <5 | [1] >5 | Dry top, slightly tacky. |
| 70 | 30% Chlorowax 70 | >20 | >50 | Slightly tacky. |
| 90 | 10% Chlorowax 70 | >20 | >50 | Wet. |
| 70 | 30% Dechlorane + | >20 | >50 | Do. |
| 90 | 10% Dechlorane + | >20 | >50 | Do. |
| 90 | 10% Parlon | ~10 | >50 | Top dry. |
| 70 | 30% Clorafin 40 | >20 | >50 | Bottom jelled, surface wet. |
| 70 | 30% Aroclor | ~2 | ~7 | Dry top, tack free. |
| 90 | 10% Aroclor 5460 | <4 | ~7 | Do. |

[1] Top wet.

EXAMPLE 16

(A) A mixture of dimers and trimers, i.e., a prepolymer, of trimethylolpropane triacrylate was prepared as follows: the benzene of a solution of 95 parts of trimethylolpropane triacrylate in 5 parts of benzene was distilled off at 60–70° C. under a reduced pressure of 30 mm. Hg absolute or less. During the course of the distillation the contents of the distillation apparatus congealed to a more or less stiff gel, depending upon the duration of the distilling procedure.

The gel was a mixture of low polymers of trimethylolpropane triacrylate. It was separable into fractions of varying degrees of polymerization by consecutive extraction with appropriate solvents; for example, a benzene extract contained only the monomer, dimer, and some trimer which could be separated from each other by fractional precipitation with hexane. Fluorinated hydrocarbons could be used to dissolve higher polymers which could thus be obtained from that portion of the polymer which was insoluble in benzene.

(B) A composition prepared from 25% of a prepolymer mixture of part (A) and 75% of a 2:1 mixture of Aroclor 1260 and Santolite MHP dried in 7 seconds using a 1200-watt ultraviolet source at a distance of 10 inches.

EXAMPLE 17

A photopolymerizable composition was prepared from 95% of a 1:1 mixture of Santolite MHP and trimethylolpropane triacrylate and 5% of 2-bromoethyl methyl ether. Using a 100-watt ultraviolet source at a distance of ½ inch, the cure time was greater than 60 seconds.

EXAMPLE 18

The procedure of Example 17 was repeated except that the initiator was 1-bromo-3-(m-phenoxyphenoxy benzene) and the photopolymerizable compound was trimethyolethane triacrylate. The cure time was 60 seconds.

EXAMPLE 19–23

The procedure of Examples 1–5 was repeated using triethylene glycol dimethacrylate instead of trimethylolpropane triacrylate. The rseults were comparable.

EXAMPLES 24–28

The procedure of Examples 1–5 was repeated using trimethylolpropane trimethacrylate instead of trimethylolpropane triacrylate. The results were comparable.

EXAMPLE 29

The procedure of Example 4 was repeated using chlorendic anhydride instead of Aroclor 1260. The results were comparable.

EXAMPLES 30–39

Laminating vehicles were prepared by combining 50 parts of a photopolymerizable mixture of 50% of trimethylolpropane triacrylate and 50% of Santolite MHP with 50 parts of each of the Aroclor resins indicated below. Each of these vehicles was then tested to determine the respective curing time in an oxygen-free and oxygen-exposed environment with both the 100-watt and 1200-watt Hanovia lamps at the distance indicated. The symbol ~ is used to indicate exposure time "about" that noted, the symbol > indicates time "more than" that noted, the symbol < indicates the converse, and the symbol ≪ indicates time "much less than" that noted.

| | Wedged K-glass*, sec. | | O² exposed, sec. | |
|---|---|---|---|---|
| Aroclor (50%) | 1" Hanovia 100-watt lamp | 2" Hanovia 1200-watt lamp | 1" Hanovia 100-watt amp | 2" Hanovia 1200-watt lamp |
| AC 1221 | <10 | >5 | >60 | >30 |
| AC 1232 | ~5 | >.5 | >60 | >30 |
| AC 1242 | ~4 | >0.5 | >60 | >15 |
| AC 1248 | ~3 | >0.5 | >60 | >4 |
| AC 1254 | <10 | ≪0.5 | <15 | >0.5 |
| AC 1262 | <10 | ≪0.25 | 2–5 | <0.25 |
| AC 4464 | >15 | ≪0.5 | 2–10 | <0.5 |
| AC 5442 | >15 | ≪0.5 | >15 | <0.75 |
| AC 1260 | | ≪0.5 | | <0.5 |
| 1:1 1262:1242 | | >0.5 | | <1 |

*The composition was spread over the surface of a glass slide to a thin film (~1 to 10 microns). A transparent film of cellophane was placed over the slide to enclose the layer to be polymerized. The wedged system was then exposed to U.V. energy through the transparent cellophane film.

NOTE: Tear seal for K film at 2".

EXAMPLES 40–68

The procedures of Examples 1 through 29 were repeated except that instead of being exposed to ultraviolet light the samples were passed on a conveyor belt beneath the beam of a 300,000-volt linear electron accelerator at a speed and beam current so regulated as to produce a dose rate of 0.5 megarad.

These systems produced resinous materials of varying degrees of hardness in films from 0.5 to 20 mils thick.

EXAMPLE 69

A thin film of a composition containing 70% of a 70/30 mixture of a prepolymer mixture of trimethylolpropane triacrylate and Santolite MHP and 30% of Unichlor–70B, a chlorinated paraffin manufactured by Neville, was applied to a sheet of aluminum plate and then exposed to a 1200-watt ultraviolet source at a fixed distance. The film was cured in 0.5 second.

EXAMPLE 70

The procedure of Example 69 was repeated except that the substrate was a sheet of paper. The film was cured in 0.5 second.

EXAMPLE 71

Lithol rubine red pigment (15%) was ground into the composition of Example 16(B) to give a printing ink. It was exposed to ultraviolet light as in Example 69. The curing time was 0.75 second.

EXAMPLE 72

A laminate was made of a film of polymer-coated cellophane and a film of oriented polypropylene with the composition of Example 16(B) between the two. The laminate was exposed to ultraviolet light as in Examples 1–5, and a tight bond was effected in 0.5 second.

EXAMPLE 73

A laminate was made of a sheet of copper and a film of Mylar with the composition of Example 16(B) between the two. The laminate was exposed to electron beam radiation as in Examples 40–68. A tight seal was effected.

EXAMPLE 74

The procedures of Examples 16(B), 19–28, 40–68, 72, and 73 were repeated except that the initiators were 2-bromoethyl methyl ether, 1-bromo-3-(m-phenoxyphenoxy benzene), and chlorendic anhydride instead of Aroclor 1260. The results were comparable.

EXAMPLE 75

The procedures of Examples 69–71 were repeated except that the initiators were 2-bromoethyl methyl ether and chlorendic anhydride instead of Unichlor–70B. The results were comparable.

The trademarks used in the foregoing examples are defined as follows:

Chlorowax 70—the product of reacting paraffin with 70% of chlorine.

Clorafin 40—the product of reacting paraffin with 40% of chlorine.

Unichlor—a light colored liquid or powdered chlorinate paraffin made by reacting 40 to 70% by weight of chlorine with molten paraffin.

Unichlor–70B contains 70% of chlorine.

Vinoflex MP–400—a wholly synthetic non-hydrolyzable copolymer product supplied in the form of a white to pale yellow powder. It is a copolymer of vinyl chloride and vinyl isobutyl ether.

Parlon—in the Parlon chlorination process, natural rubber reacts with chlorine in an amount sufficient to yield a product of approximately 67% of chlorine.

Aroclor 1221—biphenyl containing 21 wt. percent chlorine.

Aroclor 1232—biphenyl containing 32 wt. percent chlorine.

Aroclor 1242—biphenyl containing 42 wt. percent chlorine.

Aroclor 1248—biphenyl containing 48 wt. percent chlorine.

Aroclor 1254—biphenyl containing 54 wt. percent chlorine.

Aroclor 1260—biphenyl containing 60 wt. percent chlorine.

Aroclor 1262—biphenyl containing 62 wt. percent chlorine.

Aroclor 1268—biphenyl containing 68 wt. percent chlorine.

Aroclor 5460—triphenyl containing 60 wt. percent chlorine.

Aroclor 5442—triphenyl containing 42 wt. percent chlorine.

Aroclor 4465—mixture of bi- and triphenyls containing 65% by weight of chlorine.

What is claimed is:

1. A radiation-curable solvent-free composition consisting essentially of (1) about 25 to 95 percent by weight of a mixture of (a) about 15 to 90 percent weight of at least one ester of an ethylenically unsaturated acid and a dihydric alcohol or a trihydric alcohol and (b) about 10 to 85 percent by weight of an aryl sulfonamide-formaldehyde resin and (2) about 5 to 75 percent by weight of at least one halogenated aromatic, alicyclic, or aliphatic hydrocarbon photoinitiator wherein all of the halogen atoms are attached directly to the ring in the aromatic and alicyclic compounds and to the carbon chain in the aliphatic compounds.

2. A radiation-curable solvent-free composition consisting essentially of (1) about 25 to 95 percent by weight of a mixture of (a) about 15 to 90 percent by weight of at least one ester of an ethylenically unsaturated acid and a dihydric alcohol or a trihydric alcohol and (b) about 10 to 85 percent by weight of cetyl vinyl ether and (2) about 5 to 75 percent by weight of at least one halogenated aromatic, alicyclic, or aliphatic hydrocarbon photoinitiator wherein all of the halogen atoms are attached directly to the ring in the aromatic and alicyclic compounds and to the carbon chain in the aliphatic compounds.

3. The composition of claim 1 wherein the ester (a) is an acrylate, a methacrylate, or an itaconate of the alcohol.

4. A method of improving the radiation-curable properties of the mixture (1) of claim 1 which comprises adding to the mixture about 5 to 75 percent by weight, based on the total composition, of a halogenated aromatic, alicyclic, or aliphatic hydrocarbon photoinitiator wherein all of the halogen atoms are attached directly to the ring in the aromatic and alicyclic compounds and to the carbon chain in the aliphatic compounds.

5. The composition of claim 1 wherein the ester is a monomer.

6. The composition of claim 1 wherein the ester is a prepolymer.

7. The composition of claim 1 wherein the mixture (1) comprises (a) about 40 to 60 percent by weight of trimethylolpropane triacrylate and (b) about 40 to 60 percent of a p-toluene sulfonamide formaldehyde resin.

8. The composition of claim 1 wherein the photoinitiator (2) is chlorinated, brominated, or iodinated.

9. The composition of claim 1 wherein from about 20 to 50 percent by weight of the composition is a polychlorinated polyphenyl resin photoinitiator.

10. The composition of claim 1 wherein the mixture (1) contains about 50 percent by weight of trimethylolpropane triacrylate and about 50 percent by weight of a p-toluene sulfonamide formaldehyde resin and the photoinitiator (2) is a polychlorinated polyphenyl resin.

11. A method of drying which comprises exposing the composition of claim 1 to radiation.

12. A method of drying which comprises exposing the composition of claim 1 to electron beam radiation.

13. A method of drying which comprises exposing the composition of claim 1 to ultraviolet light.

14. A method of drying which comprises exposing the composition of claim 5 to radiation.

15. A method of drying which comprises exposing the composition of claim 6 to ultraviolet light.

16. A method of drying which comprises exposing the composition of claim 6 to electron beam radiation.

17. An article having a dried coating of the composition of claim 1 thereon.

18. A radiation-curable printing ink comprising (1) the composition of claim 1 as the binder and (2) a coloring agent selected from the group consisting of dyes and pigments.

19. A method of laminating which comprises joining two members with an intermediate layer comprising the composition of claim 1 and exposing said intermediate layer to a source of radiation whereby said intermediate layer is dried and adhesively joins said members.

20. A method of laminating which comprises joining two members with an intermediate layer comprising the composition of claim 1, at least one of said members being capable of transmitting ultraviolet light, and exposing said intermediate layer to ultraviolet light whereby said intermediate layer is dried and adhesively joins said members.

21. A method of laminating which comprises joining two members with an intermediate layer comprising the composition of claim 1, at least one of said members being capable of transmitting high energy electrons, and exposing said intermediate layer to electron beam radiation whereby said intermediate layer is dried and adhesively joins said members.

22. An adhesive comprising the composition of claim 1.

23. A coating composition comprising the composition of claim 1.

24. A radiation-curable element comprising a support and a coating thereon of the radiation-curable composition of claim 1.

25. The composition of claim 2 wherein the ester (a) is an acrylate, a methacrylate, or an itaconate of the alcohol.

26. The composition of claim 2 wherein the photoinitiator is chlorinated, brominated, or iodinated.

27. The composition of claim 2 wherein from about 20 to 50 percent by weight of the composition is a polychlorinated polyphenyl resin.

28. A radiation-curable printing ink comprising (1) the composition of claim 2 as the binder and (2) a coolant.

29. An adhesive comprising the composition of claim 2.

30. A coating composition comprising the composition of claim 2.

31. An article having a dried coating thereon of the composition of claim 2.

32. A radiation-curable element comprising a support and a coating thereon of the radiation-curable composition of claim 2.

33. A method of drying which comprises exposing the composition of claim 2 to radiation.

34. A method of laminating which comprises joining two members with an intermediate layer comprising the composition of claim 2 and exposing the intermediate layer to a source of radiation whereby the intermediate layer is dried and adhesively joins the members.

35. A method of improving the radiation-curable properties of the mixture (1) of claim 2 which comprises adding to the mixture about 5 to 75 percent by weight, based on the total composition, of a halogenated aromatic, alicyclic, or aliphatic hydrocarbon photoinitiator wherein all of the halogen atoms are attached directly to the ring in the aromatic and alicyclic compounds and to the carbon chain in the aliphatic compounds.

References Cited

UNITED STATES PATENTS

| | | | |
|---|---|---|---|
| 2,505,067 | 4/1950 | Sachs et al. | 204—159.23 |
| 2,548,685 | 4/1951 | Sachs et al. | 204—159.23 |
| 2,940,952 | 6/1960 | Miller | 204—159.23 |
| 3,203,802 | 8/1965 | Burg | 204—159.23 |
| 3,368,900 | 2/1968 | Burg | 204—159.23 |

SAMUEL H. BLECH, Primary Examiner

R. B. TUBER, Assistant Examiner

U.S. Cl. X.R.

117—12, 93.31, 124, 132, 138.8, 155, 161; 156—322; 161—184, 218, 249; 204—159.15, 159.23; 260—23, 39, 41, 78.5, 86.1, 836, 837, 85, 872, 885